United States Patent

Li

[11] Patent Number: 5,923,964
[45] Date of Patent: Jul. 13, 1999

[54] NITRIDE ENCAPSULATED THIN FILM TRANSISTOR FABRICATION TECHNIQUE

[75] Inventor: Jia Li, San Antonio, Tex.

[73] Assignees: Sony Corporation; Sony Electronics Inc., both of Park Ridge, N.J.

[21] Appl. No.: 08/783,111

[22] Filed: Jan. 14, 1997

Related U.S. Application Data

[62] Division of application No. 08/543,404, Oct. 16, 1995, Pat. No. 5,616,933.

[51] Int. Cl.⁶ .................................................. H01L 21/84
[52] U.S. Cl. .......................................... 438/158; 438/287
[58] Field of Search ..................................... 438/158, 287

[56] References Cited

U.S. PATENT DOCUMENTS

| | | | |
|---|---|---|---|
| 4,619,034 | 10/1986 | Janning | 438/158 |
| 4,960,719 | 10/1990 | Tanaka et al. | 438/158 |
| 5,075,244 | 12/1991 | Sakai et al. . | |
| 5,210,045 | 5/1993 | Possin et al. | 438/158 |
| 5,273,920 | 12/1993 | Kwasnick et al. | 438/158 |
| 5,284,789 | 2/1994 | Mori et al. . | |
| 5,311,040 | 5/1994 | Hiramatsu et al. | 257/57 |
| 5,440,168 | 8/1995 | Nishimura et al. | 257/640 |
| 5,455,182 | 10/1995 | Nishimoto et al. | 438/158 |
| 5,567,633 | 10/1996 | Gosain et al. | 438/158 |

*Primary Examiner*—Richard Booth
*Attorney, Agent, or Firm*—Wood, Herron & Evans, LLP

[57] ABSTRACT

A thin film transistor includes a thin film transistor body above a gate electrode. The thin film transistor body is hydrogenated to prevent the transistor body from apparently capturing and releasing electrons. The transistor body itself is coated with an upper and lower layer of silicon nitride to prevent the trapped hydrogen from migrating out of the transistor body over time. This is formed by depositing a layer of silicon dioxide, then a layer of silicon nitride over the gate electrode, followed by deposition of a polysilicon layer which is then etched to form the transistor body. This is hydrogenated after threshold adjustment implant and source/drain implant and subsequently coated with an upper sealing layer of silicon nitride. This enables the establishment of relatively high Ion/Ioff ratio and improves the reliability of the transistor.

6 Claims, 2 Drawing Sheets

NITRIDE ENCAPSULATED THIN FILM TRANSISTOR FABRICATION TECHNIQUE

This application is a divisional application of Ser. No. 08/543,404, entitled "Nitride Encapsulated Thin Film Transistor Fabrication Technique," filed Oct. 16, 1995, now U.S. Pat. No. 5,616,933.

BACKGROUND OF THE INVENTION

Thin film transistors are used in a variety of different applications, such as in metal oxide semiconductor Static Random Access Memory (SRAM) fabrication processes, and flat panel liquid crystal displays, as well as many other applications. These are frequently formed from polysilicon. The grain boundaries of polysilicon thin film transistor bodies normally have dangling bonds. These dangling bonds can trap and release electrons during thin film transistor operation. This affects the thin film transistor threshold voltage and reduces Ion/Ioff ratio.

In certain applications a lower Ion/Ioff ratio can be tolerated. In other operations it cannot, and the thin film transistor is hydrogenated to eliminate these dangling bonds and establish a higher Ion/Ioff ratio. Unfortunately, the deposited hydrogen tends to migrate with time, and the dangling bonds in effect reappear. Eventually, this ruins the transistor, shortening the life time of the product.

Such hydrogenated thin film transistors are well known. Generally, these are formed by depositing a layer of silicon dioxide over the gate electrodes. A polysilicon layer is then deposited and etched to form the transistor body which will become the channel, source, and drain of the transistor after source/drain implant. This is then coated with a silicon dioxide layer. Subsequent to the deposition of the second silicon dioxide layer and the source/drain implant, the polysilicon is hydrogenated by exposing the wafer to a hydrogen plasma, or by implanting hydrogen ions into the polysilicon layer. This is then coated with a thicker layer of silicon dioxide or a layer of silicon nitride. Contacts for metal to connect the gate electrode layer are then opened using a photolithography technique, followed by deposition, photo printing and etching of a metal layer as transistor terminal leads.

Such a prior art transistor is shown in FIG. 1 which is a cross-sectional view of a prior art thin film transistor 50. The substrate 51 includes interconnect lines 52 and 53 and gate electrode 54. As shown, the transistor further includes a heavily doped drain and a lightly doped drain 56 adjacent the channel of the transistor 57. This is directly above the gate dielectric 58. Lead 59 for the source of the transistor connects through a contact opening to interconnect line 52 which in turn connects through a buried contact to the extension of the source electrode of the transistor. The metal lead 60 for the drain connects to a drain electrode through interconnect line 55 in the same manner, while the metal lead for the gate (out of the plane and not shown) connects to the extension of the gate electrode through a contact opening. It should be noted that connection of the source, the drain, and the gate electrode to other elements of the circuit do not have to go through the metal layer and can be accomplished through the use of interconnect lines on the gate electrode layer or the extension of these electrodes themselves.

With this process the hydrogen ions that have been bonded to the dangling bonds of the polysilicon transistor body layer can migrate out of the polysilicon transistor body layer as previously indicated. Over time this can cause the transistor to fail.

SUMMARY OF THE INVENTION

Accordingly, it is an object of the present invention to provide a thin film transistor which has a relatively high Ion/Ioff ratio and wherein the migration of the hydrogen subsequent to hydrogenation is eliminated.

According to the present invention, hydrogen migration out of a hydrogenated thin film transistor is avoided by coating the upper and lower surface of the transistor body with a barrier layer. The preferred barrier layer is silicon nitride which in effect keeps the hydrogen atoms within the polysilicon and prevents the grain boundaries of polysilicon from erratically trapping and releasing electrons during operation.

The objects and advantages of the present invention will be further appreciated in light of the following detailed drawings and description in which:

DETAILED DESCRIPTION

Figure 1:
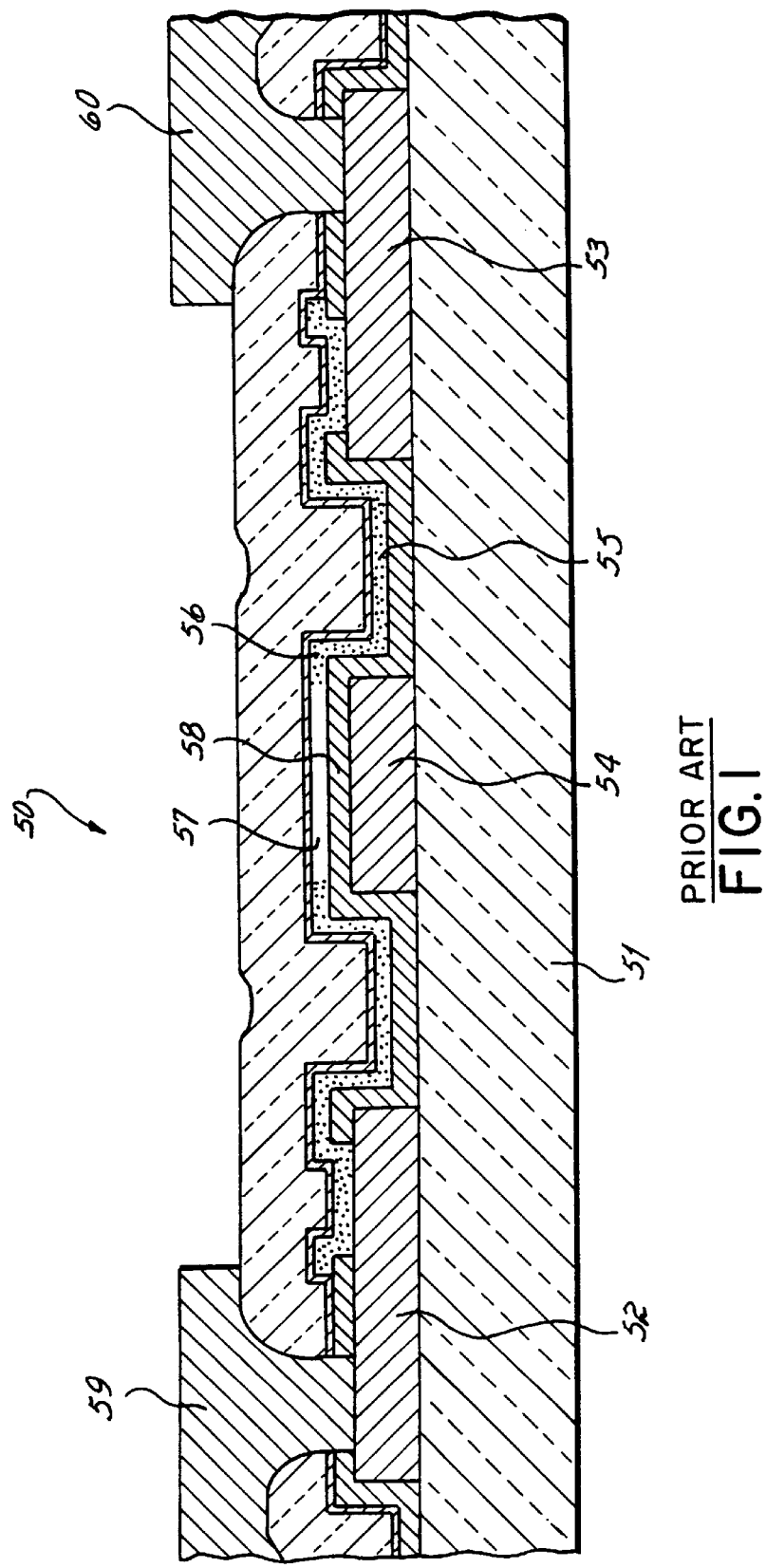
FIG. 1 is a cross-sectional view of a finished prior art thin film transistor.
Figure 2:
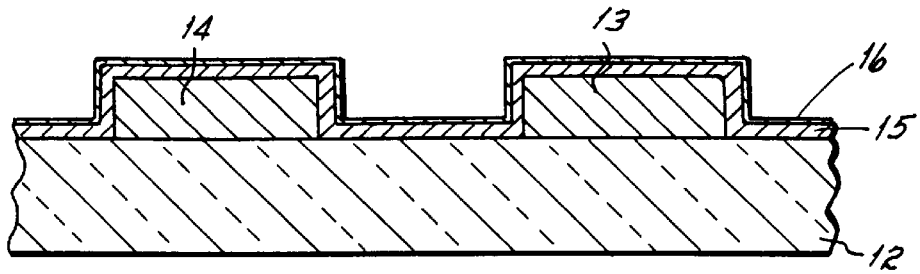
FIG. 2 is a cross-sectional view of a first step of the present invention.
Figure 3:
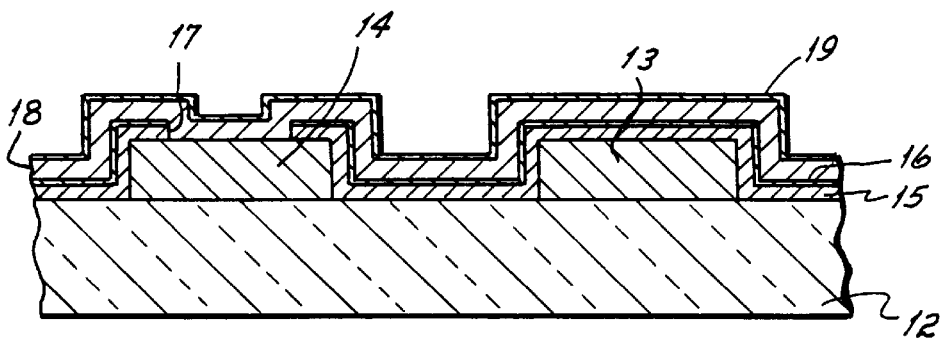
FIG. 3 is a diagrammatically cross sectional view of a subsequent step in the formation of the thin film transistor of the present invention.

As shown in FIG. 2, in order to form a thin film transistor according to the method of the present invention, a gate electrode 13 and a connection line 14 are formed over a substrate 12. Generally in practicing the present invention the substrate 12 will be silicon, glass, quartz, sapphire, or any other substrate typically employed for semiconductors. Generally silicon wafers will be employed. These frequently already have bulk transistors and interconnect layers with vertical isolation layers and the like. The gate electrode 13 and the connection line 14 are deposited on the semiconductor substrate 12 generally by low pressure chemical vapor deposition, sputtering or other appropriate methods followed by photolithographic etching. The electrode 13 and the connection line 14 can be any suitable conductor, such as highly doped polysilicon, tantalum silicide or tungsten silicide.

After the electrode 13 and the connection line 14 have been deposited, photolithographically defined and etched and the wafer cleaned, a silicon dioxide layer 15 is deposited. This can be deposited by low pressure chemical vapor deposition or by plasma enhanced chemical vapor deposition.

The preferred method of depositing this film is low pressure chemical vapor deposition. Preferably the silicon dioxide film will have a thickness of 100 to about 1,000 Å depending on the particular application. After deposition, the silicon dioxide layer can be annealed as may be required.

The deposition of the silicon dioxide layer is then followed by the deposition of a sealing or barrier layer 16 which is designed to prevent migration of hydrogen ions. Generally this will be a layer of silicon nitride. The thickness of the layer of silicon nitride will vary depending upon the desired effective thickness for the gate dielectric layer. Since the silicon nitride layer combined with the previously deposited silicon dioxide layer 15 will function as the gate dielectric, the thickness of the silicon dioxide will be varied accordingly. The silicon nitride layer thickness can be varied from 100 Å to several hundred angstroms if desired. Alternately, the silicon dioxide layer can be eliminated and a thicker layer of silicon nitride applied if desired. However, the silicon dioxide provides certain functional advantages and therefore is preferred.

Subsequent to the deposition of the silicon nitride layer 16, any contact holes 17 (only one shown) are opened by photolithographic etching as required to connect the to be deposited transistor body to the connection line 14.

Next a semiconductor layer 18 is deposited. Generally polycrystalline silicon is employed for this layer. The particular thickness of the semiconductor layer will vary depending upon-desired application but will generally be 100 Å to 1,000 Å or thicker.

Polycrystalline silicon can be deposited by known techniques such as low pressure chemical vapor deposition. This can either be deposited as polysilicon layer or can be deposited as an amorphous silicon and annealed at a temperature of about 650° C. to form the polysilicon. The semiconductor layer 18 is then coated with a thin optional layer 19 of silicon dioxide. This will generally be deposited by chemical vapor deposition and have a thickness of 100–150 Å. The purpose of this deposition is to avoid contamination of the polycrystalline silicon layer by the subsequent photoresist masking layer as is disclosed in copending application Ser. No. 08/361,207 filed Dec. 21, 1994 entitled "THIN FILM TRANSISTOR FABRICATION TECHNIQUE" the disclosure of which is incorporated herein by reference.

Figure 4:
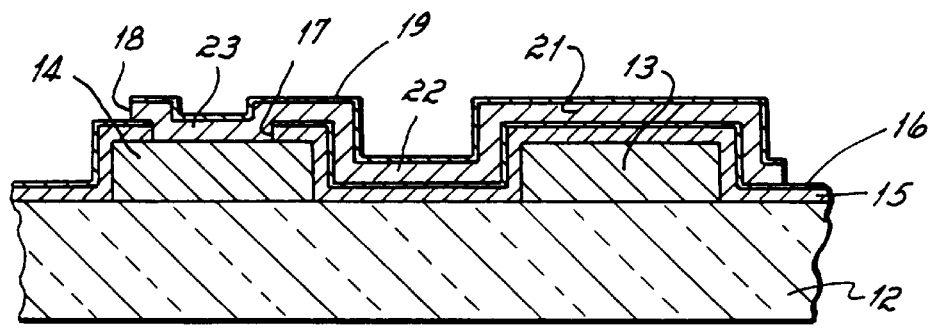
FIG. 4 is a diagrammatic cross sectional view showing a subsequent step in the formation of the thin film transistor of the present invention.

As shown more particularly in FIG. 4, a transistor body 21 and connection line 22 are then formed from the polysilicon layer 18 with part of the connection line covering contact opening 23. This is done by depositing a photoresist masking layer (not shown) over the silicon dioxide 19 and subsequently etching away portions of the oxide layer 19 and polysilicon layer 18 to establish the transistor body 21 above the gate electrode 13 and connection line 22.

After defining the transistor body 21, the transistor is selectively implanted with ions with Group III or Group V ions, such as boron ions, to establish the threshold voltage of the thin film transistor. Depending on the particular application, connection lines and sources and drains can be implanted to establish the desired resistivity. As the formation of the particular source and drains is well known to those skilled in the art and per se does not form part of the invention.

After the sources and drains have been formed as desired, the transistor is hydrogenated by exposing the wafer to a hydrogen plasma for 30–60 minutes, with an RF power of about 500 Watts, and with a hydrogen flow rate of 100–500 SCCM. Alternately the last polysilicon layer can be hydrogenated by implanting $10^{14}$ to $10^{15}$ hydrogen ions per square centimeter into the polysilicon layer. This will passivate the grain boundaries of the polysilicon to reduce the number of dangling bonds inside the polysilicon grain boundary.

Figure 5:
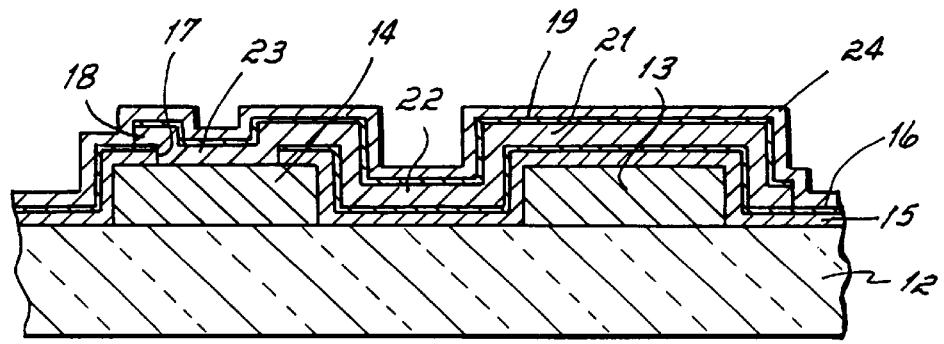
FIG. 5 is a cross sectional diagrammatic view of a thin film transistor formed according to the method of the present invention.

As shown in FIG. 5, a layer of silicon nitride 24 is deposited over the transistor body. This layer of silicon nitride is preferably on the order of 200 Å–1,000 Å.

This completes the process for the formation of the transistor module and the wafer itself is then ready for further processing and to be used for example in CMOS SRAM integrated circuit. This hydrogenation will improve the Ion/Ioff ratio of the thin film transistor, and the nitride encapsulation will prevent the hydrogen atoms from escaping from the thin film transistor body layer.

This has been a description of the present invention along with the preferred method of practicing the present invention currently know to the inventor. However, the invention itself should be defined only by the appended claims wherein we claim:

1. A method of forming a thin film transistor comprising depositing a first sealing layer over a gate electrode;

depositing a semiconductor layer;

etching said semiconductor layer to establish a transistor body above said gate electrode;

implanting ions of group III or group V elements to adjust a threshold voltage of the transistor and to form a source and a drain of the transistor;

hydrogenating said transistor body and coating said transistor body with a second sealing layer;

thereby forming a thin film transistor wherein said transistor body is a hydrogenated semiconductor transistor body adjacent said gate electrode separated from said gate electrode by a gate dielectric;

wherein said transistor body has a top surface covered by said second sealing layer and a bottom surface covered by said first sealing layer and separating said transistor body from said gate electrode;

wherein said first and second searing layers are effective to prevent hydrogen migration from said transistor body.

2. The method claimed in claim 1 wherein said sealing layer comprises silicon nitride.

3. The method claimed in claim 2 wherein said semiconductor comprises polysilicon.

4. The method claimed in claim 3 further comprising coating said gate electrode with silicon dioxide prior to depositing said first layer of silicon nitride.

5. The method claimed in claimed 4 comprising coating said polysilicon layer with silicon dioxide prior to etching said polysilicon transistor body layer.

6. A method of forming a thin film transistor comprising forming a gate electrode on a substrate depositing a first layer of silicon dioxide over said gate electrodes;

depositing a first layer of silicon nitride over said first layer of silicon dioxide;

depositing a layer of polysilicon over said first layer of silicon nitride;

depositing a second layer of silicon dioxide over said polysilicon layer and etching said second layer of silicon dioxide, said polysilicon layer to establish a thin film transistor body;

implanting ions of group III or group V elements to adjust a threshold voltage of the transistor and to form a source and a drain for said transistor;

hydrogenating said transistor body to bind hydrogen to dangling bonds in grain boundaries of said transistor body;

depositing a second layer of silicon nitride over said transistor body;

wherein said first layer of silicon nitride and said second layer of silicon nitride are effective to prevent hydrogen migration from said transistor body.

\* \* \* \* \*

UNITED STATES PATENT AND TRADEMARK OFFICE
CERTIFICATE OF CORRECTION

PATENT NO. : 5,923,964

DATED : July 13, 1999

INVENTOR(S) : Jia Li

It is certified that error appears in the above-identified patent and that said Letters Patent is hereby corrected as shown below:

Claim 1, line 19 reads "searing" and should read --sealing--.

Signed and Sealed this

Twenty-seventh Day of March, 2001

*Attest:*

NICHOLAS P. GODICI

*Attesting Officer*  Acting Director of the United States Patent and Trademark Office